United States Patent
Park et al.

(10) Patent No.: US 9,865,627 B2
(45) Date of Patent: Jan. 9, 2018

(54) DISPLAY DEVICE AND METHOD OF MANUFACTURING DISPLAY DEVICE USING A MASK

(71) Applicant: LG DISPLAY CO., LTD., Seoul (KR)

(72) Inventors: Chan Park, Goyang-si (KR); JeongKweon Park, Paju-si (KR); SangEun Jun, Paju-si (KR); HeungJu Jo, Chungju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 65 days.

(21) Appl. No.: 14/717,561

(22) Filed: May 20, 2015

(65) Prior Publication Data
US 2016/0063938 A1    Mar. 3, 2016

(30) Foreign Application Priority Data
Aug. 31, 2014  (KR) .......................... 10-2014-0114753

(51) Int. Cl.
| | |
|---|---|
| *G06F 3/041* | (2006.01) |
| *H01L 27/12* | (2006.01) |
| *C23C 14/04* | (2006.01) |
| *C23C 14/34* | (2006.01) |

(52) U.S. Cl.
CPC ........ *H01L 27/1262* (2013.01); *C23C 14/042* (2013.01); *C23C 14/34* (2013.01); *G06F 2203/04107* (2013.01)

(58) Field of Classification Search
None
See application file for complete search history.

(56) References Cited

U.S. PATENT DOCUMENTS

| | | | |
|---|---|---|---|
| 2013/0059063 A1* | 3/2013 | Kawato | C23C 14/042 427/66 |
| 2015/0070604 A1* | 3/2015 | Chen | G06F 3/044 349/12 |
| 2017/0123570 A1* | 5/2017 | Maruyama | G06F 3/0416 |

* cited by examiner

*Primary Examiner* — Joseph Haley
(74) *Attorney, Agent, or Firm* — Dentons US LLP

(57) ABSTRACT

Disclosed is a method of manufacturing a display device having a display area and a non-display area, the method including aligning a mask over a substrate, the mask including a central shield portion, a peripheral shield portion outside the central shield portion, with an opening between the central shield portion and the peripheral shield portion, a holding portion in the opening that connects the central shield portion with the peripheral shield portion, and a diffusion area under the holding portion defined by a thickness difference of the mask between the holding portion and one of the central and peripheral shield portions; depositing a conductive material on the substrate through the mask to form a single pieced, loop-shaped conductive path surrounding the display area in the non-display area; and forming a transparent conductive layer on the substrate, the transparent conductive layer being continuously formed in the display and non-display areas and formed to be in direct contact with the single pieced, loop-shaped conductive path.

15 Claims, 16 Drawing Sheets

(1)

(2)

(1)

(2)

(1)

(2)

DISPLAY DEVICE AND METHOD OF MANUFACTURING DISPLAY DEVICE USING A MASK

This application claims the priority of Korean Patent Application No. 10-2014-0114753 filed on Aug. 31, 2014, in the Korean Intellectual Property Office, the disclosure of which is incorporated herein by reference for all purposes as if fully set forth herein.

BACKGROUND OF THE INVENTION

Field of the Invention

The present invention relates to a display device and a method of manufacturing a display device using a mask. More specifically, the present disclosure relates to a display device including a continuous, single-pieced, loop-shaped conductive path.

Discussion of the Related Art

Presently, there are two ways to form a metal wiring in a continuous loop-shape.

The first method is the ink jetting method, in which metal particles or pigments are printed on a targeted surface by using a jetting nozzle. Such a method is referred to hereinafter as "jetting." In this method, a desired shape can be freely formed by adjusting the location and moving speed of a jetting nozzle, and the jetting rate. Various factors can affect the adherence of the metal pigments onto the targeted surface. Therefore, the jetting method often requires additional processes such as curing or baking by applying thermal energy to keep the metal pigments adhered on the targeted surface. In some cases, however, a desired adherence may not be obtained even with the curing or baking process, and a metal wiring formed with the metal pigments may be stripped away from the surface during a number of processes that follows. Further, the size of the nozzle hole used in the jetting method can limit the width of the metal wiring, making it difficult to obtain desired electrical properties from the metal wiring.

The second way is to deposit a conductive material onto a surface of a substrate by utilizing sputter phenomena. This way is referred to hereinafter as sputtering. Sputtering is a type of physical vapor deposition (PVD) methods. The sputtering involves bombardment of a source material by energetic particles (e.g., positive ions of the plasma) so that atoms are ejected from the source material and deposited on the targeted surface.

Generally, the atoms ejected from the source material are deposited onto the areas on a substrate exposed through openings of a mask. In this method, the width and the thickness of the metal wiring can be controlled by adjusting the distance of the mask from the targeted surface while carrying out the sputtering process. While the sputtering method allows to provide wider metal wiring than the jetting method, the patterning mechanism of the sputtering method makes it difficult to form a metal wiring in a continuous loop-shaped pattern.

SUMMARY OF THE INVENTION

Accordingly, the present invention is directed to provide a display device and method of manufacturing the same using a mask that substantially obviates one or more problems due to limitations and disadvantages of the related art.

An advantage of the present invention is directed to provide a display device including a continuous, single-pieced, loop-shaped conductive path.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described, a display device may, for example, include a substrate having a display area and a non-display area outside the display area; a single-pieced, loop-shaped conductive path surrounding the display area in the non-display area on the substrate; and a transparent conductive layer continuously disposed in the display and non-display area and being in direct contact with the single-pieced, loop-shaped conductive path, wherein the single-pieced, loop-shaped conductive path includes a first portion and a second portion that are made of a same conductive material, and wherein the single-pieced, loop-shaped conductive path in the second portion has a plurality of depressions of the conductive material in a thickness direction.

In another aspect of the present invention, a method of manufacturing a display device having a display area and a non-display area, the method may, for example, include aligning a mask over a substrate, the mask including a central shield portion, a peripheral shield portion outside the central shield portion, with an opening between the central shield portion and the peripheral shield portion, a holding portion in the opening that connects the central shield portion with the peripheral shield portion, and a diffusion area under the holding portion defined by a thickness difference of the mask between the holding portion and one of the central and peripheral shield portions; depositing a conductive material on the substrate through the mask to form a single pieced, loop-shaped conductive path surrounding the display area in the non-display area; and forming a transparent conductive layer on the substrate, the transparent conductive layer being continuously formed in the display and non-display areas and formed to be in direct contact with the single pieced, loop-shaped conductive path.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE ILLUSTRATED EMBODIMENTS

Figure 1:
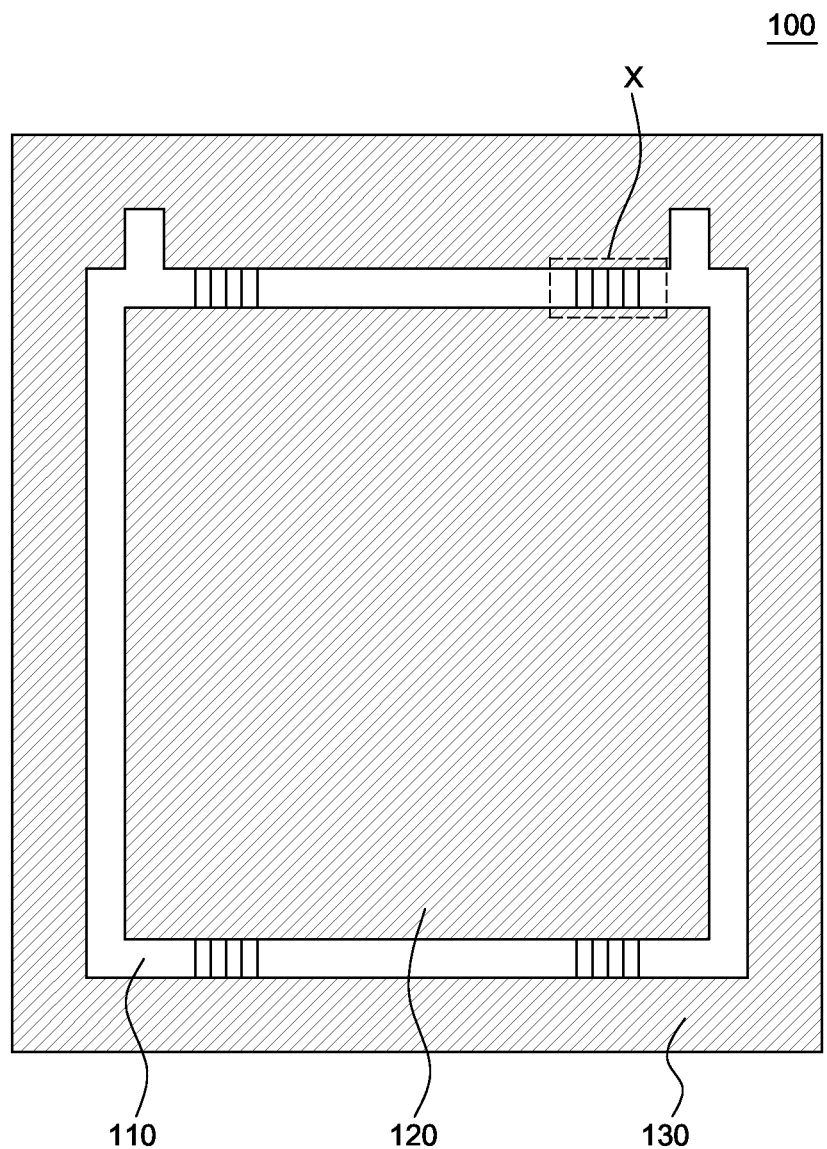
FIG. 1 is a plan view of a mask according to an exemplary embodiment of the present disclosure.

Advantages and features of the present invention and methods to achieve them will become apparent from the descriptions of exemplary embodiments herein below with reference to the accompanying drawings. However, the present invention is not limited to exemplary embodiments disclosed herein but may be implemented in various different forms. The exemplary embodiments are provided for making the disclosure of the present invention thorough and for fully conveying the scope of the present invention to those skilled in the art. It is to be noted that the scope of the present invention is defined only by the claims.

The figures, dimensions, ratios, angles, numbers of elements given in the drawings are merely illustrative and are not limiting.

Like reference numerals denote like elements throughout the descriptions.

In describing the present disclosure, descriptions on well-known technologies may be omitted in order not to obscure the gist of the present disclosure.

It is to be noticed that the terms "comprising," "having," "including" and so on, used in the description and claims, should not be interpreted as being restricted to the means listed thereafter unless specifically stated otherwise.

As used herein, where an indefinite or definite article is used when referring to a singular noun, e.g. "a," "an," "the," this includes a plural of that noun unless specifically stated otherwise.

As used herein, in describing elements, they are interpreted as including error margins even without explicit statements.

As used herein, in describing positional relationship, such as "an element A on an element B," "an element A above an element B," "an element A below an element B" and "an element A next to an element B," another element C may be disposed between the elements A and B unless the term "directly," "immediately" or "in contact with" is explicitly used.

As used herein, the terms first, second, third and the like in the descriptions and in the claims are used for distinguishing between similar elements and not necessarily for describing a sequential or chronological order. These terms are used to merely distinguish one element from another. Accordingly, as used herein, a first element may be a second element within the technical idea of the present disclosure.

In addition, in describing elements of the present disclosure, terms such as first and second, and symbols such as A, B, (a), (b), etc. can be used. These terms are used to merely distinguish an element from another but not to limit the essential feature, order, sequence or the number of the element. As used herein, phrases "an element A connected to an element B" or "an element A coupled with an element B" refer to that the element A may be directly connected to/coupled with the element B and/or that the element A may be indirectly connected to/coupled with the element B via another element C.

As used herein, a loop-shaped conductive path refers to a conductive path having a ring shape that separates a closed inner side from an outer side. For example, the conductive path may have a circle shape having an open center, an elliptical shape having an open center, a rectangular shape having an open center, a square having an open center, a diamond shape having an open center, a trapezoid shape having an open center, and an amorphous shape having an open center.

As used herein, a conductive path configured as a single piece refers to a conductive path that is a continuous path having no disconnected portions. Specifically, all parts of the conductive path are formed simultaneously so that the conductive path is seamless and has no overlapped portions.

Features of various exemplary embodiments of the present disclosure may be combined partially or totally. As will be clearly appreciated by those skilled in the art, technically various interactions and operations are possible. Various exemplary embodiments can be practiced individually or in combination.

<Mask>

A mask according to an exemplary embodiment of the present disclosure will be described with reference to FIGS. 1 to 4.

FIG. 1 is a plan view of a mask 100 according to an exemplary embodiment of the present disclosure. FIG. 1 may be either a plan view of a single mask 100 or a plan view of a portion of a single mask 100. In other words, FIG. 1 may be either a plan view of a single mask 100 having a loop-shaped opening or may be a plan view of one of several loop-shaped openings 110 of a single mask 100.

The mask includes a central shield portion 120, a peripheral shield portion 130, holding portions, and an opening 110.

The central shield portion 120 is isolated from the other portions except for the holding portions. In other words, the central shield portion 120 has an island shape when viewed from the top of the mask 100. The central shield portion 120 is surrounded by the peripheral shield portion 130 and the opening 110. More specifically, the central shield portion 120 is partitioned off by the opening 110. In other words, the central shield portion 120 is an area surrounded by the opening 110. For example, the central shield portion 120 may have a rectangular or square shape.

The peripheral shield portion 130 is spaced apart from the central shield portion 120 by a predetermined distance. The peripheral shield portion 130 is located on the outer side than the central shield portion 120 such that it surrounds the central shield portion 120 and the opening 110. For example, the peripheral shield portion 130 may have a ring or square shape. When sputtering is performed on a substrate by using the mask 100 according to the exemplary embodiment of the present disclosure, sputtered particles are deposited on surfaces of the central shield portion 120 and the peripheral shield portion 130, so that they are not deposited on portions of the surface of the substrate under the central shield portion 120 and the peripheral shield portion 130.

The holding portions connect the central shield portion 120 with the peripheral shield portion 130. Although not shown in the drawings, the holding portions create a level difference between the central shield portion 120 and the peripheral shield portion 130.

The opening 110 is an empty space in the mask 100. The opening 110 has a substantially loop shape. For example, the opening 110 may have a rectangular or square ring shape. When sputtering is performed on a substrate by using the mask 100 according to the exemplary embodiment of the present disclosure, sputtered particles pass through the opening 110 and are deposited on portions of the surface of the substrate under the opening 110. In other words, the opening 110 is formed as the central shield portion 120 is spaced apart from the peripheral shield portion 130 by a predetermined distance.

Referring to FIG. 1, portion X is a part of the mask 100 where the holding portions are located. Although not shown in the drawings, the holding portions have a level difference from the central shield portion 120 and the peripheral shield portion 130 such that diffusion areas are formed and defined by the holding portions, the central shield portion 120 and the peripheral shield portion 130. That is, a diffusion area (not shown) refers to an empty space under the respective holding portion that is created by a difference in thickness level between the holding portion and at least one of the central and peripheral shield portions 120, 130. The holding portions and the diffusion areas (not shown) will be described in detail with reference to FIGS. 2A to 3D.

Figure 2A:
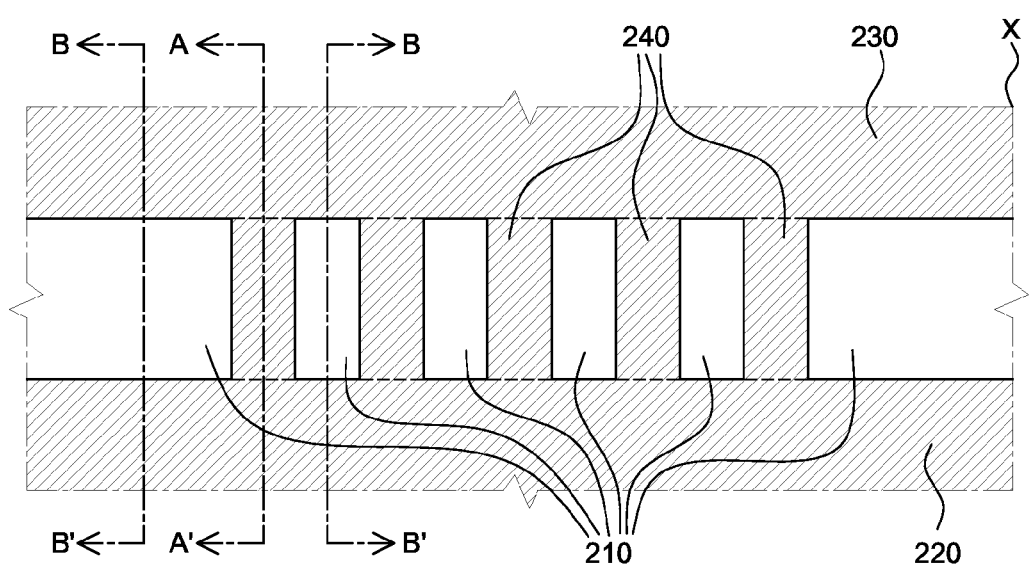
FIG. 2A is an enlarged plan view of portion X of the mask shown in FIG. 1 according to an exemplary embodiment.

FIG. 2A is an enlarged plan view of portion X of the mask 100 shown in FIG. 1 according to an exemplary embodiment.

The mask 100 according to the exemplary embodiment illustrated in FIG. 2A incudes holding portions 240 having a stripe or ladder pattern. The holding portions 240 connect the central shield portion 220 with the peripheral shield portion 230. To that end, the holding portions 240 may be located between the central shield portion 220 and the peripheral shield portion 230. For example, the holding portion 240 may be connected to a side face of the central shield portion 220 and to an opposing side face of the peripheral shield portion 230. In this regard, the opening 210 is formed as the central shield portion 220 is spaced apart from the peripheral shield portion 230 by a predetermined distance.

The diffusion areas (not shown) are defined by a difference in thickness level between the holding portions 240 and the two shield portion 230, 220. In the plan views of FIGS. 1 and 2A, the opening 210 looks as though it is a single continuous space except for the areas occupied by the holding portions 240. Exemplary ways, in which the holding portions 240 are connected to the central shield portion 220 and to the peripheral shield portion 230, will be described with reference to FIGS. 2B and 2C.

Figure 2B:
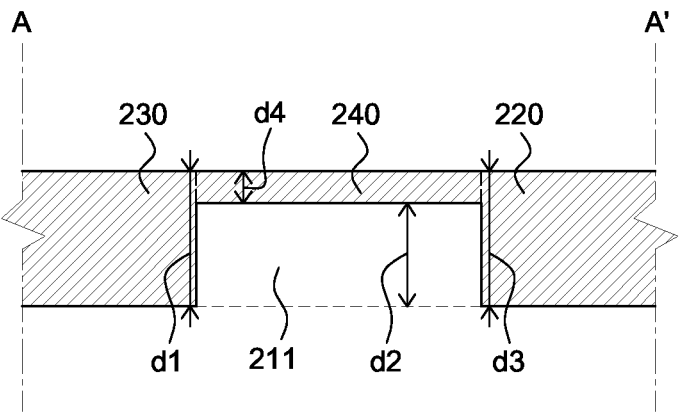
FIG. 2B is a cross-sectional view of the peripheral shield portion, a support portion and the central shield portion, taken along line A-A' of FIG. 2A.
Figure 2B:
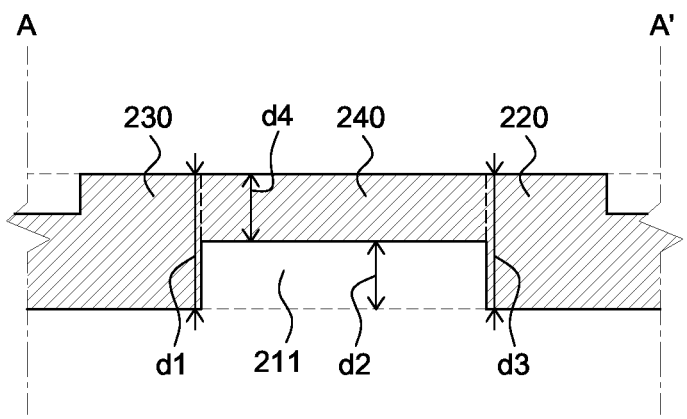

FIG. 2B is a cross-sectional view of the peripheral shield portion 230, a holding portion 240 and the central shield portion 220, taken along line A-A' of FIG. 2A. The masks 100 according to the exemplary embodiments of the present disclosure illustrated in FIGS. 2B(1) and (2) are merely examples, and the shape of the holding portions 240 is not limited thereto.

The mask 100 according to the exemplary embodiment of the present disclosure will be described with reference to FIG. 2B(1).

The peripheral shield portion 230 and the central shield portion 220 have no level difference therebetween. In other words, the peripheral shield portion 230 and the central shield portion 220 both have substantially an equal, overall thickness. One surface of the peripheral shield portion 230 and one surface of the central shield portion 220 may be in the same plane.

Now, a holding portion 240 will be described. The holding portion 240 is connected to a side face of the central shield portion 220 and to an opposing side face of the peripheral shield portion 230. The thickness $d4$ of the holding portion 240 plus the thickness $d2$ of a diffusion area 211 is equal to or less than the thickness $d3$ at the side face of the central shield portion 220 and the thickness $d1$ at the opposing side face of the peripheral shield portion 230. Namely, the sum of the thickness $d4$ of the holding portion 240 and the thickness $d2$ of the diffusion area 211 is equal to or less than the thickness $d1$ of the peripheral shield portion 230 ($d1 > d4 + d2$). Or, the sum of the thickness $d4$ of the holding portion 240 and the thickness $d2$ of the diffusion area 211 is equal to or less than the thickness $d3$ of the central shield portion 220 ($d3 > d4 + d2$).

The holding portion 240 has a surface located in a different plane from where a surface of the central shield portion 220 and a surface of the peripheral shield portion 230 are located. At least one of two surfaces of the holding portion 240 has a level difference with a surface of the central shield portion 220 and a surface of the peripheral shield portion 230. Preferably, one surface of the holding portion 240 has a level difference with a surface of the central shield portion 220 and with a surface of the peripheral shield portion 230, while the other surface of the holding portion 240 is located in the same plane as the plane the other surface of central shield portion 220 and the other surface of the peripheral shield portion 230 are located.

In some embodiments, however, the other surface of the holding portion 240 also has a level difference with the other surface of the central shield portion 220 and the other surface of the peripheral shield portion 230. The holding portion 240 is connected to a side face of the central shield portion 220 and an opposing side face of the peripheral shield portion 230. The thickness $d4$ of the holding portion 240 plus the thickness $d2$ of the diffusion area 211 is less than the thickness $d3$ at the side face of the central shield portion 220 and the thickness d1 at the opposing side face of the peripheral shield portion 230.

Now, the diffusion area 211 will be described. The diffusion area 211 is formed as the peripheral shield portion 230. The central shield portion 220 have a level difference with the holding portion 240. More specifically, one surface of the holding portion 240 has a level difference with a surface of the central shield portion 220 and with a surface of the peripheral shield portion 230. The height of the level difference is equal to the thickness d1 of the diffusion area 211.

As described above, in some embodiments, each of the two surfaces of the holding portion 240 may have a level difference with respective surfaces of the peripheral shield portion 230 and the central shield portion 220. In that case, the diffusion area 211 is formed on one side of the two surfaces of the holding portion 240.

In this connection, the thickness of the opening (not shown) other than the diffusion area 211 is determined by the thickness of the side face of the central shield portion 220 and the opposing side face of the peripheral shield portion 230 that define the opening (not shown). Therefore, the thickness d4 of the holding portion 240 plus the thickness d2 of the diffusion area 211 is equal to or less than the thickness of the opening, although not illustrated in FIG. 2B(1).

The mask 100 according to the exemplary embodiment of the present disclosure will be described with reference to FIG. 2B(2). In describing the mask 100 according to the exemplary embodiment illustrated in FIG. 2B(2), descriptions will be made focusing on differences from those of FIG. 2B(1), and the redundant description will be omitted.

Each of the central shield portion 220 and the peripheral shield portion 230 has a level difference. In other words, the thickness of the central shield portion 220 and the peripheral shield portion 230 are not even. For example, the central shield portion 220 may have a level difference near a position where the holding portion 240 is connected to the central shield portion 220. Or, the peripheral shield portion 230 may have a level difference near a position where the holding portion 240 is connected to the peripheral shield portion 230. In other words, the thickness of the central shield portion 230 and that of the peripheral shield portion 230 may be the greatest near positions where the holding portion 240 is connected to them, respectively.

The holding portion 240 will now be described. The thickness d4 of the holding portion 240 is equal to or greater than the thickness d2 of the diffusion area 211.

The diffusion area 211 will now be described. The thickness d2 of the diffusion area 211 is less than the thickness d3 of the side face of the central shield portion 220 and the thickness d1 of the opposing side face of the peripheral shield portion 230.

In order to form the mask 100 having such a shape, an etching process may be performed to pattern both surfaces of the mask 100. For example, a surface of a mother substrate for a mask 100 is etched by a predetermined thickness such that all areas are etched, leaving the areas where the holding portions 240 are to be formed. Further, the other surface of the mother substrate is etched by predetermined thicknesses such that the opening (not shown), the diffusion area 211 and the holding portion 240 are etched. By doing so, the depth of the diffusion area 211 and the thickness of the holding portions 240 are free from the thickness of the central shield portion 220 or the peripheral shield portion 230. In other words, it is possible to make the mask 100 in which the depth of the diffusion area 211 is sufficiently large while the thickness of the holding portion 240 is also large enough to hold the central shield portion 220.

Figure 2C:
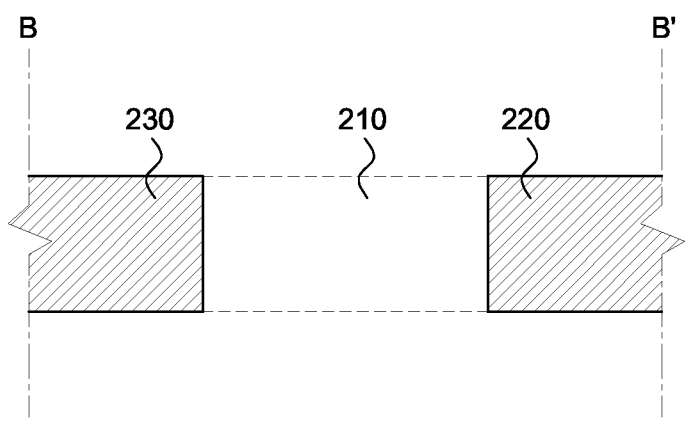
FIG. 2C is a cross-sectional view of the peripheral shield portion, the support portion and the central shield portion, taken along line B-B' of FIG. 2A.

FIG. 2C is a cross-sectional view of the peripheral shield portion 230, the holding portion 240 and the central shield portion 220, taken along line B-B' of FIG. 2A.

The mask 100 according to the exemplary embodiment of the present disclosure will be described with reference to FIG. 2C.

A space between the peripheral shield portion 230 and the central shield portion 220 has no holding portion 240 and thus is entirely exposed. That space is referred to as an opening 210. In other words, the opening 210 includes the space between the peripheral shield portion 230 and the central shield portion 220 that is not shaded by the holding portion (not shown). As described above, the existence of the holding portion (not shown) having a level difference with the peripheral shield portion 230 and the central shield portion 220 leads to the diffusion area (not shown), which is described above with reference to FIG. 2B.

The thickness of the opening 210 is determined by the thickness at a side face of the central shield portion 220 and a side face at the peripheral shield portion 230. When the peripheral shield portion 230 and the central shield portion 220 have no level difference, the thickness at a side face of the central shield portion 220 is equal to the thickness of the central shield portion 220. Also, the thickness at an opposing side face of the peripheral shield portion 230 is equal to the thickness of the peripheral shield portion 230. When each of the peripheral shield portion 230 and the central shield portion 220 has a level difference and is uneven in thickness, the thickness at a side face of the central shield portion 220 and the thickness at an opposing side face of the peripheral shield portion 230 define the thickness of the opening 210.

Figure 3A:
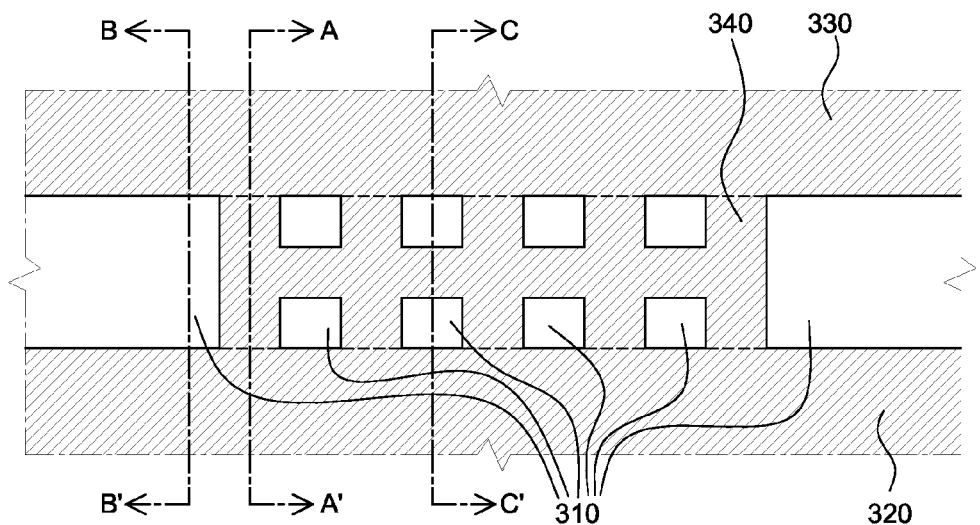
FIG. 3A is an enlarged plan view of portion X of the mask shown in FIG. 1 according to an exemplary embodiment.

FIG. 3A is an enlarged plan view of portion X of the mask 100 shown in FIG. 1 according to another exemplary embodiment.

The mask 100 includes a holding portion 340 having a grid or mesh pattern. The holding portion 340 has a plurality of open passages 310. The plurality of open passages 310 may be considered a part of the opening 310.

In describing the mask 100 according to the exemplary embodiment of FIG. 3A, descriptions will be made focusing on differences from those of FIG. 2A (the mask 100 having a stripe or ladder pattern), and thus, the redundant description will be omitted. Exemplary ways, in which the holding portion 340 is connected to the central shield portion 320 and the peripheral shield portion 330, will be described with reference to FIGS. 3B and 3C.

Figure 3B:
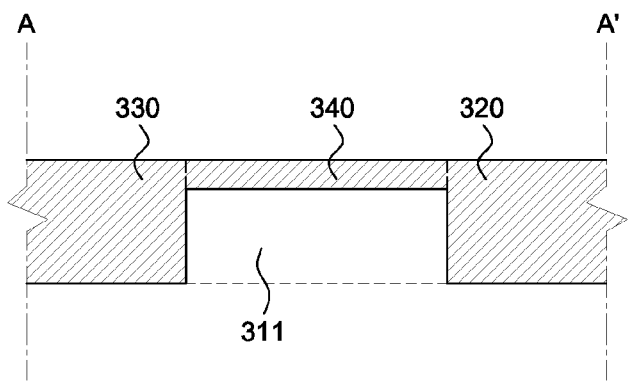
FIG. 3B is a cross-sectional view of the peripheral shield portion, the support portion and the central shield portion, taken along line A-A' of FIG. 3A.

FIG. 3B is a cross-sectional view of the peripheral shield portion 330, the holding portion 340 and the central shield portion 320, taken along line A-A' of FIG. 3A. The mask 100 according to the exemplary embodiment of the present disclosure illustrated in FIG. 3B is merely an example, and the shape of the holding portion 340 is not limited thereto. For example, in the enlarged plan view of portion X of the mask 100 according to the exemplary embodiment illustrated in FIG. 3A, a cross-sectional view of the peripheral shield portion 330, the holding portion 340 and the central shield portion 320 taken along line A-A' may be replaced by FIGS. 2B(1) and (2).

Figure 3C:
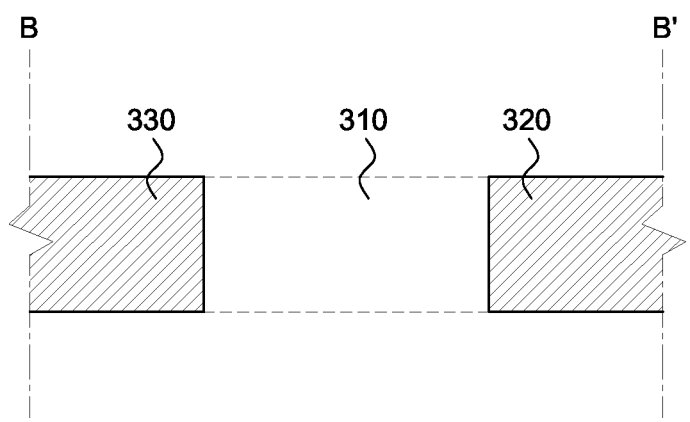
FIG. 3C is a cross-sectional view of the peripheral shield portion, the support portion and the central shield portion, taken along line B-B' of FIG. 3A.

FIG. 3C is a cross-sectional view of the peripheral shield portion 330, a holding portion 340 and the central shield portion 320, taken along line B-B' of FIG. 3A. The descriptions on the mask 100 according to the exemplary embodiment illustrated in FIG. 2C can be equally applied to the mask 100 according to the exemplary embodiment illustrated in FIG. 3C.

FIG. 3C is a cross-sectional view of the peripheral shield portion 330, a holding portion 340 and the central shield portion 320, taken along line B-B' of FIG. 3A. As the mask 100 according to the exemplary embodiment illustrated in FIG. 3A has the holding portion 340 in a grid or mesh pattern, the holding portion 340 is connected to neither the central shield portion 320 nor the peripheral shield portion 330 in a cross-sectional view taken along C-C'. The masks 100 according to the exemplary embodiments of the present disclosure illustrated in FIGS. 3D(1) and (2) are merely examples, and the shape of the holding portion 340 is not limited thereto.

The mask 100 according to the exemplary embodiment of the present disclosure will be described with reference to FIG. 3D(1). In describing the mask 100 according to the exemplary embodiment of FIG. 3D(1), descriptions will be made focusing on differences from those of FIG. 2B(1), and thus, the redundant description will be omitted.

The holding portion 340 will now be described. The holding portion 340 is located between a side face of the central shield portion 320 and an opposing side face of the peripheral shield portion 330.

The opening 310 will now be described. The opening 310 is a space that is exposed or vacant, as the holding portion 340 is connected to neither the side face of the central shield portion 320 nor the opposing side face of the peripheral shield portion 330.

The mask 100 according to the exemplary embodiment of the present disclosure will be described with reference to FIG. 3D(2).

Figure 3D:
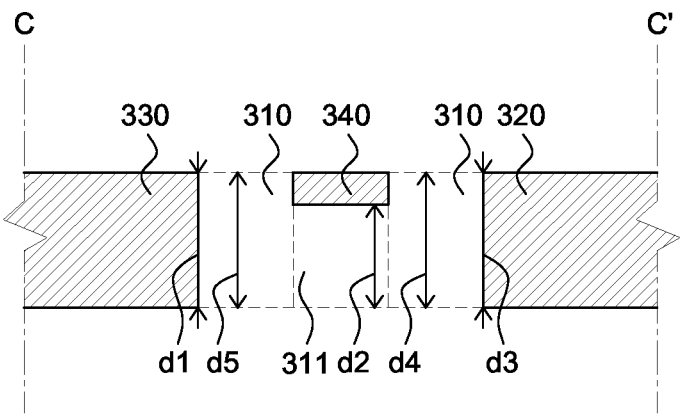
FIG. 3D is a cross-sectional view of the peripheral shield portion, the support portion and the central shield portion, taken along line B-B' of FIG. 3A.
Figure 3D:
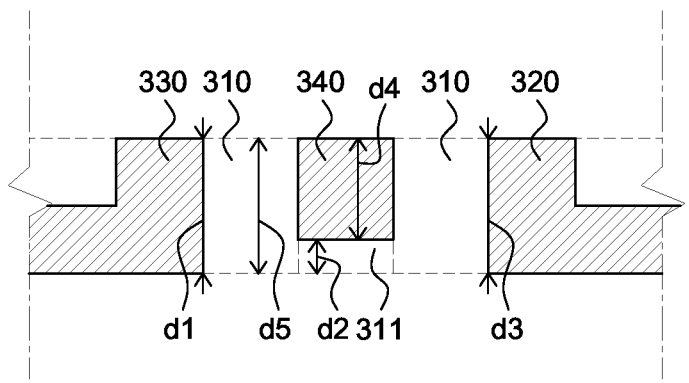

The mask 100 according to the exemplary embodiment illustrated in FIG. 3D(2) is the same as or substantially similar to the mask 100 according to the exemplary embodiment illustrated in FIG. 3D(1) with respect to the opening 310, and is the same as or substantially similar to the mask 100 according to the exemplary embodiment shown in FIG. 2B(2) with respect to the rest of the configuration. Therefore, the mask 100 according to the exemplary embodiment illustrated in FIG. 3D(2) can be understood based on the combination of the description on the mask 100 according to the exemplary embodiment illustrated in FIG. 3D(1) and the description on the mask 100 according to the exemplary embodiment illustrated in FIG. 2B(2).

Figure 4:
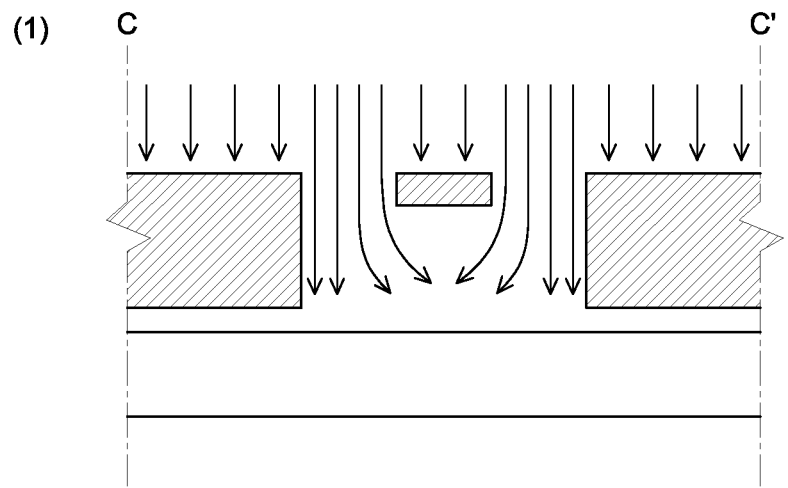
FIG. 4 is a view for schematically illustrating paths through which sputtered particles ejected from a target travel.
Figure 4:
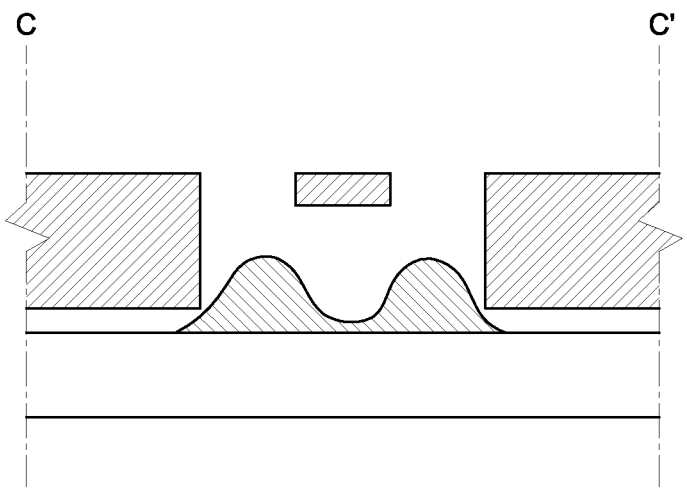

FIG. 4 is a view for schematically illustrating paths through which sputtered particles travel.

Referring to FIG. 4(1), when sputtering is performed using a mask according to an exemplary embodiment of the present disclosure, sputtered particles are diffused into a diffusion area via an opening.

Referring to FIG. 4(2), the particles diffused into the diffusion area via the opening are deposited even on a portion of a substrate under a holding portion. In other words, the sputtered particles build up on the substrate under the holding portion and form a diffusion area by diffusion phenomenon. As a result, a single, continuous sputtering deposition pattern is formed conforming to the opening of the mask. The holding portions are located between the central shield portion and the peripheral shield portion so as to physically connect them with each other. Still, the holding portions allow the deposition pattern to be formed even under them by means of diffusion patterning, so that a continuous, loop-shaped deposition pattern can be formed as a single piece.

At least two holding portions are formed in the mask 100 so that the central shield portion can be held more firmly, and thus there are at least two positions where diffusion pattern takes places. Namely, the Mask 100 has at least two diffusion areas.

<Conductive Path>

A conductive path 500 included in a display panel according to an exemplary embodiment of the present disclosure will be described with reference to FIGS. 5 to 9.

Figure 5:
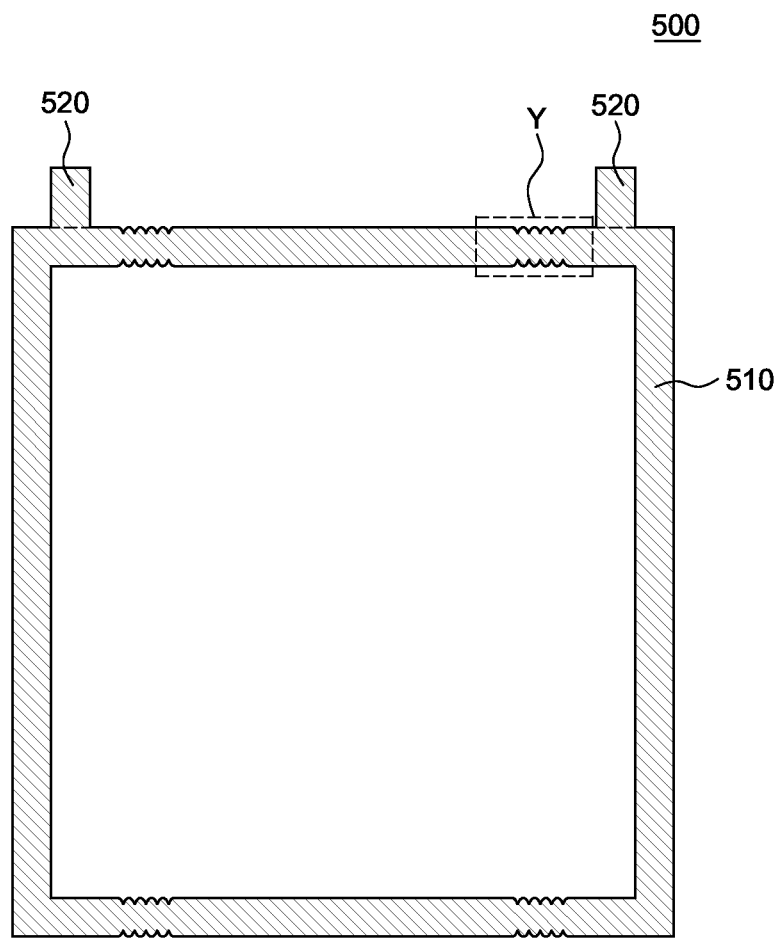
FIG. 5 is a plan view of a loop-shaped conductive path configured as a single piece according to an exemplary embodiment of the present disclosure.

FIG. 5 is a plan view of a loop-shaped, conductive path 500 configured as a single piece. The conductive path 500 illustrated in FIG. 5 may be mated with the mask 100 having the opening 110 illustrated in FIG. 1.

The conductive path 500 has a loop shape of a single piece. The conductive path 500 has at least one projecting connector portion 520 on a side face. The conductive path 500 may receive electrical signals via a projecting connector portion 520. The conductive path 500 includes a first portion 510 and second portions having different surface properties from those of the first portion 510. The first portion 510 and the second portions are made of the same conductive material. The second portion has a plurality of depressions of the conductive material in a thickness direction, and a thickness of the conductive material between the plurality of depressions is equal to or less than a thickness of the first portion. Also, a thickness of the conductive material within the plurality of depressions is less than ⅔ of that of the first portion. The second portions are formed in the diffusion area (not shown) under the holding portions. As a result, the location or the shape of the second portions depends on the locations or the shapes of the holding portions and the diffusion areas (not shown). In the FIG. 5, one of the second portions placed at portion Y. The shape of the second portions will be described in detail with reference to FIGS. 6A to 9.

Figure 6A:
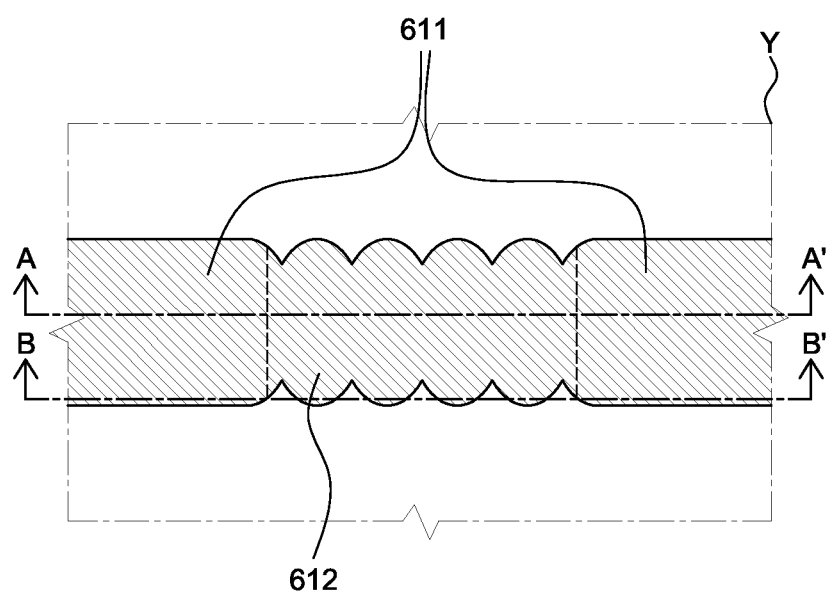
FIG. 6A is an enlarged plan view of portion Y of a conductive path deposited by sputtering using a mask having holding portions in a stripe pattern.

FIG. 6A is an enlarged plan view of portion Y of a conductive path 500 deposited by sputtering using a mask having holding portions in a stripe pattern.

The second portion 612 has edges in a wave shape. Compared to the first portion 611, the second portion 612 has grooves where deposition has not been made along the edge line. Such a wave shape or grooves at the edges of the conductive path 500 indicate that the pattern is deposited by sputtering using a mask having holding portions in a stripe pattern. The shape of the second portion 612 illustrated in FIG. 6A is merely an example, and the shape of the second portion 612 is not limited thereto.

Figure 6B:
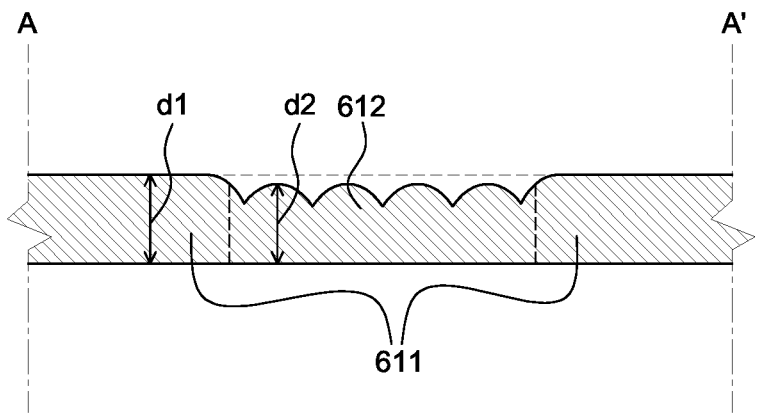
FIG. 6B is a cross-sectional view of a first portion and a second portion taken along line A-A' of FIG. 6A.

FIG. 6B is a cross-sectional view of the first portion 611 and the second portion 612 taken along line A-A' of FIG. 6A. That is to say, FIG. 6B is a cross-sectional view of a middle portion of the conductive path 500 which is cut in the direction parallel to its extending direction in the enlarged view of portion Y of the conductive path 500 illustrated in FIG. 6A.

Compared to the first portion 611, the second portion 612 has sunken deposition zones where deposition has been made weaker or thinner along the top surface, respectively. At the second portion 612, the conductive path 500 is formed to have a wavy surface at the second portion with a plurality of bulges. Such sunken deposition zones at the top surface of the conductive path 500 indicate that the pattern is deposited by sputtering using a mask having holding portions in a stripe pattern.

In middle of the second portion 612, there is a continuous, bumpy surface. The surface of the second portion 612 is bumpier than the surface of the first portion 611. Namely, the surface roughness of the second portion 612 is larger than the surface roughness of the first portion 611. Namely, the surface of the second portion 612 is rougher than the surface of the first portion 611. The thickness of the second portion 612 is not even. The thickness of the second portion 612 is equal to or less than the thickness of the first portion 611. Namely, the thickness of the second portion 612 is not larger than the thickness of the first portion 611.

Figure 6C:
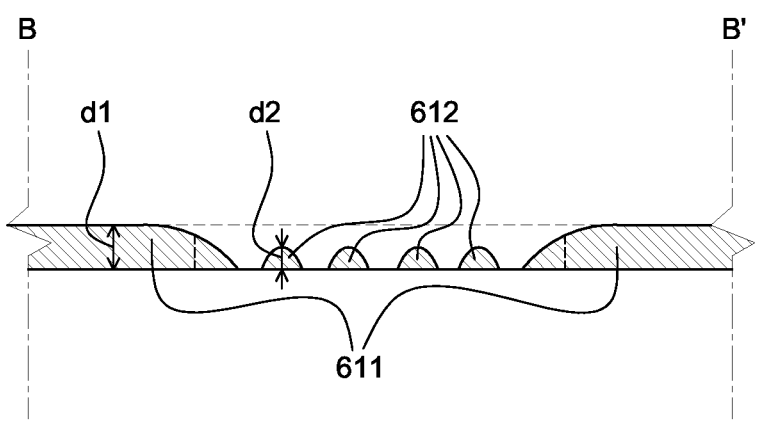
FIG. 6C is a cross-sectional view of the first portion and the second portion taken along line B-B' of FIG. 6A.

FIG. 6C is a cross-sectional view of the first portion 611 and the second portion 612 taken along line B-B' of FIG. 6A. That is to say, FIG. 6B is a cross-sectional view of an edge of the conductive path 500 which is cut in the direction parallel to its extending direction in the enlarged view of portion Y of the conductive path 500 of FIG. 6A.

The second portion 612 has an edge in a wave shape. Or, the second portion 612 has grooves, which the first portion 611 does not have, at its edges where deposition has not been made partially. In the cross-section of the edge of the conductive path 500, the second portion 612 has a bumpy surface at its edge, which is not continuous. Namely, the surface roughness of the second portion 612 is larger than the surface roughness of the first portion 611. Namely, the surface of the second portion 612 is rougher than the surface of the first portion 611. The thickness of the second portion 612 is not even. The thickness of the second portion 612 is equal to or less than the thickness of the first portion 611. Namely, the thickness of the second portion 612 is not larger than the thickness of the first portion 611.

Figure 6D:
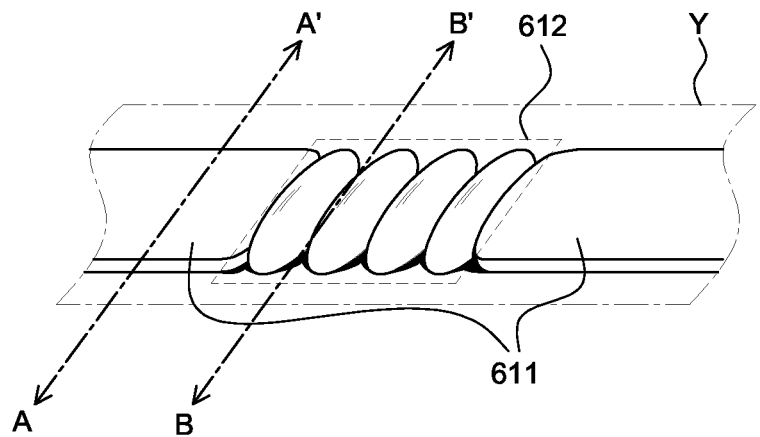
FIG. 6D is a set of an enlarged perspective view and cross-sectional views of portion Y of a conductive path deposited by sputtering using a mask having holding portions in a stripe pattern.
Figure 6D:
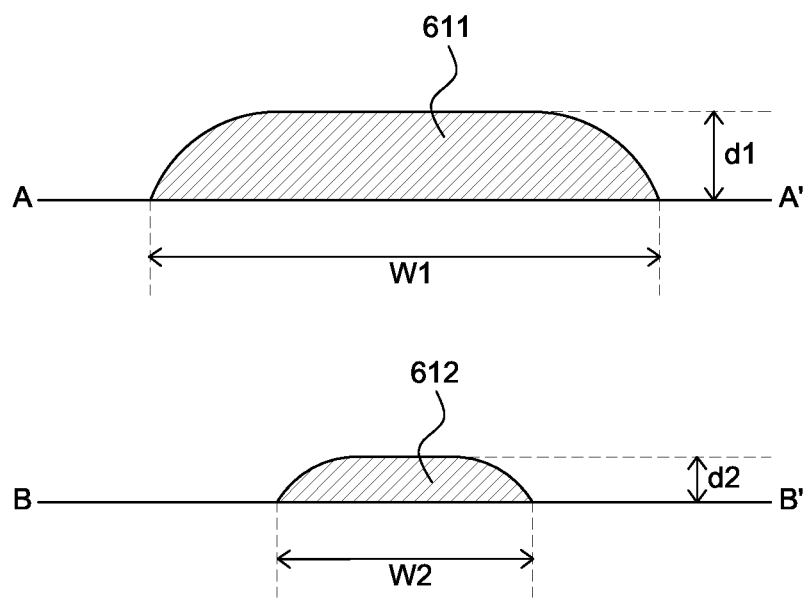

FIG. 6D(1) is an enlarged perspective view of portion Y of a conductive path 500 deposited by sputtering using a mask having holding portions in a stripe pattern.

The second portion 612 has a continuous, bumpy surface. Namely, the surface roughness of the second portion 612 is larger than the surface roughness of the first portion 611. Namely, the surface of the second portion 612 is rougher than the surface of the first portion 611. The thickness of the second portion 612 is not even. The thickness of the second portion 612 is equal to or less than the thickness of the first portion 611.

FIG. 6D(2) is a set of cross-sectional views, one of which is a cross-sectional view of the first portion 611 taken along line A-A' of FIG. 6D(1) and the other of which is a cross-sectional view of the second portion 612 taken along line B-B' which corresponds to one of the sunken deposition zones. The width w2 of the cross-section of the second portion 612 is equal to or less than the width w1 of the cross-section of the first portion 611. The height d2 of the cross-section of the second portion 612 is equal to or less than the height d1 of the cross-section of the first portion 611.

Figure 7:
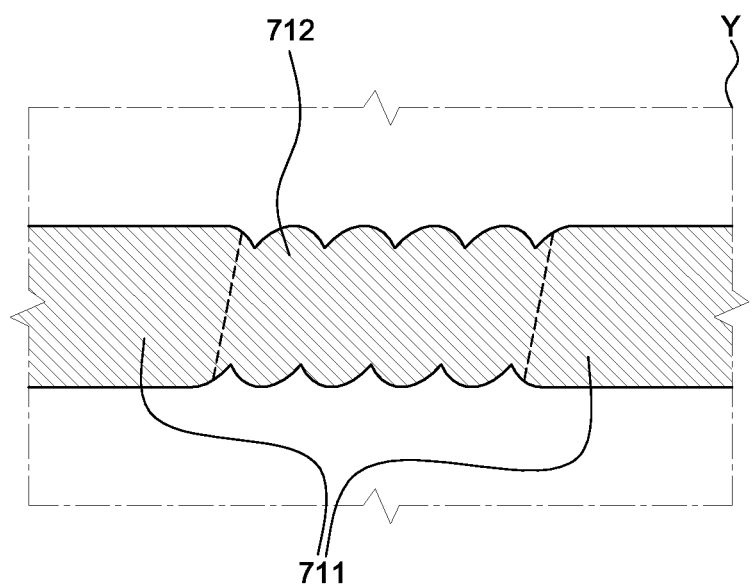
FIG. 7 is an enlarged plan view of a second portion of a conductive path deposited by sputtering using a mask having holding portions in an inclined stripe pattern.

FIG. 7 is an enlarged plan view of portion Y of a conductive path 500 deposited by sputtering using a mask 100 having holding portions in a stripe pattern inclined by a predetermined angle.

The second portion 712 has edges in a wave shape. Compared to the first portion 711, the second portion 712 has grooves where deposition has not been made. Such a wave shape or grooves at the edges of the conductive path 500 indicate that the pattern is deposited by sputtering using a mask 100 having holding portions in a stripe pattern inclined by a predetermined angle.

Figure 8:
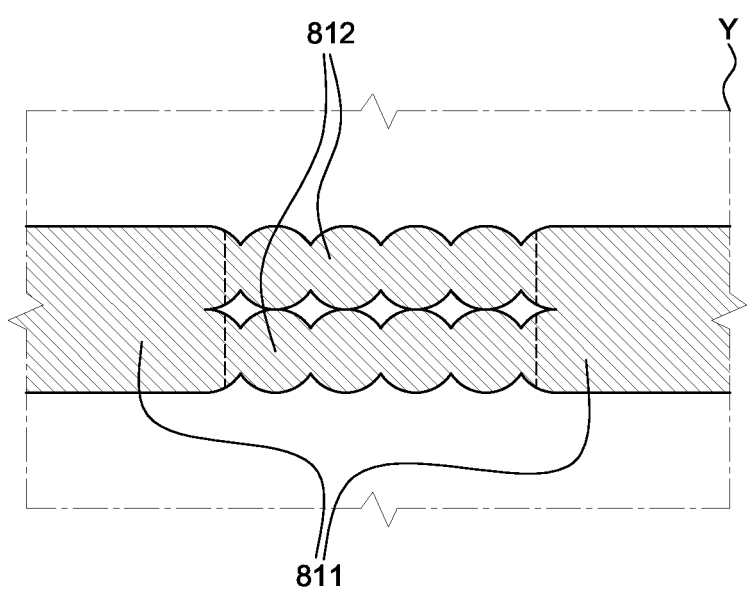
FIG. 8 is an enlarged plan view of portion Y of a conductive path deposited by sputtering using a mask having holding portions in a mesh or grid pattern.

FIG. 8 is an enlarged plan view of portion Y of a conductive path 500 deposited by sputtering using a mask 100 having holding portions in a mesh or grid pattern.

The second portion 812 has edges in a wave shape. Compared to the first portion 811, the second portion 812 has grooves where deposition has not been made. Such a wave shape or grooves at the edges of the conductive path 500 indicate that the pattern is deposited by sputtering using a mask 100 having holding portions in a mesh or grid pattern.

Figure 9:
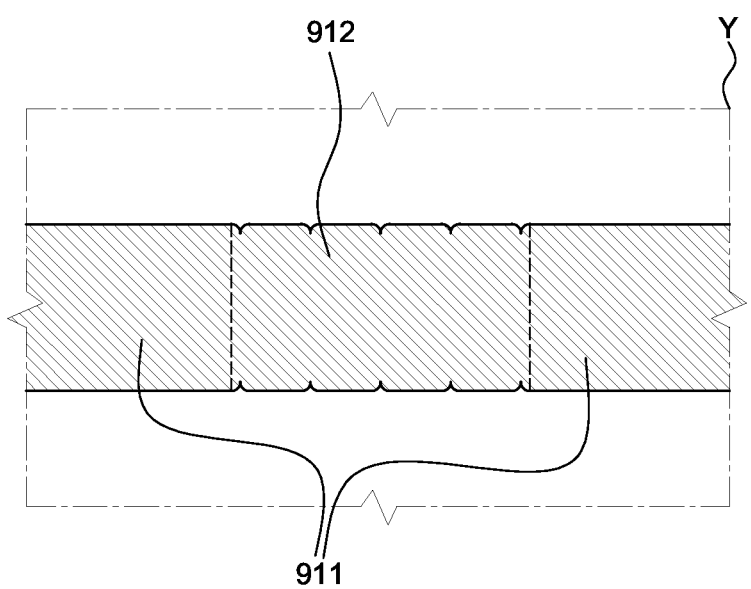
FIG. 9 is an enlarged plan view of portion Y of a conductive path deposited by sputtering using a mask having holding portions in a stripe pattern.

FIG. 9 is an enlarged plan view of portion Y of a conductive path 500 deposited by sputtering using a mask 100 having holding portions in a stripe pattern.

The second portion 912 has edges in a wave shape. Compared to the first portion 911, the second portion 912 has grooves where deposition has not been made along the edge line. Such a wave shape or grooves at the edges of the conductive path 500 indicate that the pattern is deposited by sputtering using a mask 100 having holding portions in a stripe or ladder pattern. Even though both of the conductive paths in FIGS. 6A and 9 have the holding portions in the similar stripe pattern, the holding portions in FIG. 9 are thinner and have a wider space therebetween than those in FIG. 6A. Specifically, as the framework of the holding portions become thinner and the distance between the framework of holding portions becomes larger, the wave shape or grooves at the edges and the sunken deposition zones at the top surface of the second portions become smaller and resemble the edges of the first portion.

The conductive path 500 is made of a material having good conductivity. For example, the conductive path 500 may be made of a metal material such as silver, copper, chrome, etc. or an alloy thereof. For the conductive path 500, the surface resistance of the first portion is smaller than the surface resistance of the second portion.

<Display Device Including Conductive Path>

A display panel 1000 according to an exemplary embodiment of the present disclosure will be described with reference to FIG. 10.

A loop-shaped conductive path 1024, which is configured as a single piece, may be disposed in the display panel 1000 that emits light to display images recognized as information by a viewer. In the display panel 1000 according to this exemplary embodiment of the present disclosure, the conductive path 1024 is disposed in a non-display area I/A, other than a display area A/A, in which images are displayed. The non-display area I/A is disposed around the display area A/A. For example, the non-display area I/A may surround the display area A/A. The conductive path 1024 may be located in the non-display area I/A so as to surround the display area A/A. Exemplary ways in which the loop-shaped conductive path 1024 is located in the display panel 1000 will be described in detail with reference to FIG. 10.

Figure 10:
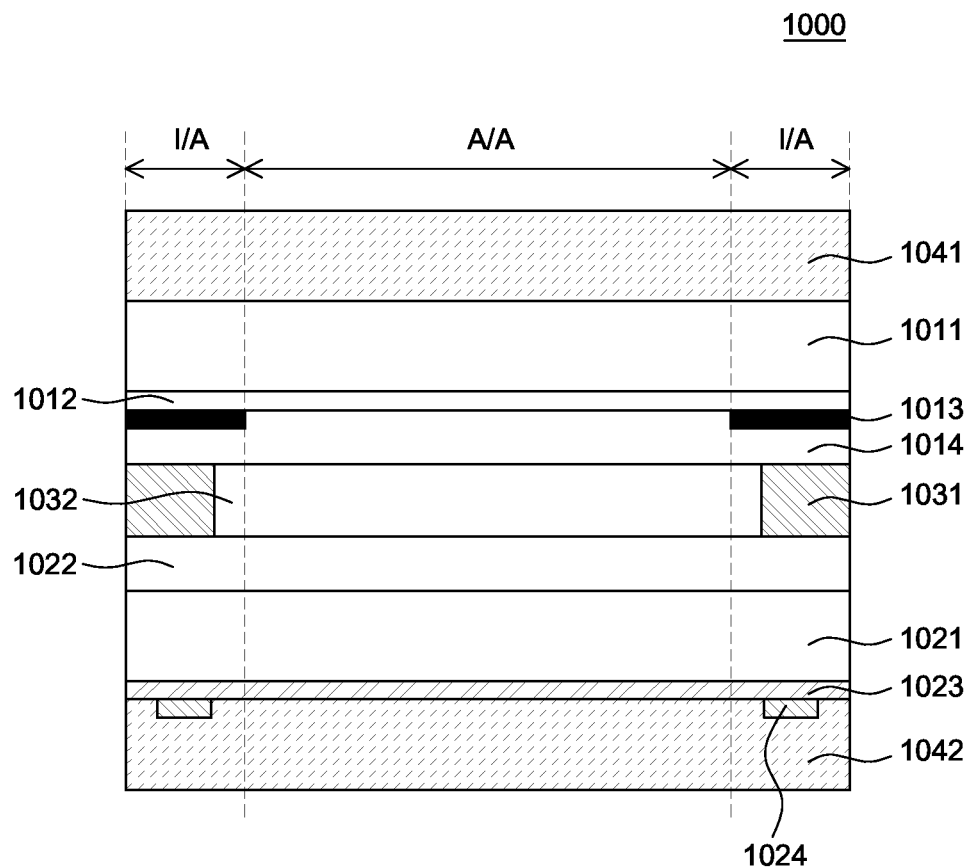
FIG. 10 is a cross-sectional view of a display panel according to an exemplary embodiment of the present disclosure.

FIG. 10 is a cross-sectional view of a display panel 1000 according to an exemplary embodiment of the present disclosure. In this exemplary embodiment of FIG. 10, the display panel 100 is a liquid crystal display (LCD). However, this is merely illustrative and not limiting. That is to say, the display panel 1000 may be an organic light emitting display (OLED), for example. Again, in the display panel 1000 according to this exemplary embodiment of the present disclosure, a loop-shaped conductive path 1024, which is a single piece, is disposed in a non-display area I/A.

The display panel 1000 according to this exemplary embodiment is partitioned into a display area A/A and the non-display area I/A around the display area A/A. Although not shown in the drawing, the non-display area I/A surrounds the display area A/A. Therefore, in the cross-section, the non-display area I/A is located at the either edge of the display panel 1000.

The display panel 1000 according to the exemplary embodiment of the present disclosure includes: a lower polarizing layer 1042; a conductive path 1024 disposed in a non-display area VA of the lower polarizing layer 1042; a conductive layer 1023 disposed on the conductive path 1024 and the lower polarizing layer 1042; a lower substrate 1021 disposed on the conductive layer 1023; a TFT element layer 1022 disposed on the lower substrate 1021; a sealing unit 1031 disposed in the non-display area I/A on the TFT element layer 1022; a liquid crystal layer 1032 filling a gap located on the TFT element layer 1022, the gap surrounded by the sealing unit 1031 to be spaced by a spacer (not shown); a planarization layer 1014 disposed on the sealing unit 1031 and the liquid crystal layer 1032; a black matrix 1013 disposed on the planarization layer 1014 to define the non-display area I/A; a color filter layer 1012 disposed on the black matrix 1013 and the planarization layer 1014; an upper substrate 1011 disposed on the color filter layer 1012; and an upper planarization layer 1041 disposed on the upper substrate 1011. The display panel 1000 may be included various type of display device like smart phone, laptop computer, Tablet or TV.

The black matrix 1013 is formed to hide edge portions of the display panel 1000 where images are not displayed. Namely, the black matrix 1013 is formed in the non-display area I/A. By means of the black matrix 1031, an area in which images are displayed to a viewer, i.e., the display area A/A is defined. The black matrix 1013 serves to hide a variety of wirings, signal lines and tapes. It may include black resin comprising carbon black pigment to absorb light.

Although not shown in FIG. 10, a touch sensor (not shown) may be disposed inside or outside the display panel 1000. The touch sensor (not shown) may be coupled with the display panel 1000 in the form of a touch screen panel having a separate substrate. Alternatively, the touch sensor (not shown) may be coupled with the display panel 1000 in the form of a film. Alternatively, the touch sensor (not shown) may be disposed on/under the upper substrate 1011 and/or the lower substrate 1021 in the form of touch electrodes as a component of the display panel 1000.

The TFT element layer 1022 includes: a plurality of gate lines arranged in a direction and spaced apart from one another by a predetermined distance; a plurality of data lines arranged in a direction perpendicular to the direction in which the gate lines are arranged and spaced apart from one another by a predetermined distance; a plurality of pixel electrodes formed in a matrix in pixel areas is defined by the gate lines and the data line that are crossing one another; and a plurality of thin-film transistors TFTs being switched by signals from the gate lines to deliver signal from the gate lines to the pixel electrodes. By the TFT element layer 1022, the liquid crystal layer 1032 is driven.

The conductive layer 1023 may be employed for the purpose of preventing a touch signal that is erroneously operated due to a driving signal applied to the TFT element layer 1022 for driving liquid crystals. To this end, the conductive layer 1023 is a signal interference shield layer. In the touch sensor (not shown), a voltage signal is applied to touch electrodes to detect a location of a touch. At the same time, in the TFT element layer 1022, a voltage signal is applied to pixel electrodes and a common electrode to drive liquid crystals. At this time, a touch electrode of the touch sensor acts as a first electrode, while a pixel electrode or a common electrode of the TFT element layer 1022 acts as a second electrode.

Parasitic capacitance may be generated between the first electrode and the second electrode with a variety of structural layers therebetween as a dielectric layer. Due to such parasitic capacitance, the voltage signal applied to a pixel electrode or the common electrode in the TFT element layer 1022 may interfere with the voltage signal applied to touch electrodes of the touch sensor. In other words, the voltage signal applied to the pixel electrode or the common electrode in the TFT element layer 1022 may work as noise in the voltage signal applied to touch electrodes of the touch sensor.

In case of an in-cell touch type in which a touch sensor is disposed between the upper substrate 1011 and the lower substrate 1021, the conductive layer 1023 is formed on the other surface of the lower substrate 1021 other than the surface on which the TFT element layer 1022 is formed. Namely, if the TFT element layer 1022 is formed on a surface of the lower substrate 1021, the conductive layer 1023 is formed on the other surface of the lower substrate 1021. Beneficially, the conductive layer 1023 is transparent, since the light emitted from a backlight unit (not shown), which is to be coupled with the display panel 1000, is to be incident on the display panel 1000.

On the other hand, in case of an on-cell touch type in which a touch sensor is disposed on the upper substrate 1011, the conductive layer 1023 is formed on the other surface of the upper substrate 1011 other than the surface on which the color filter layer 1012 is formed. Namely, if the color filter layer 1012 is formed on a surface of the upper substrate 1011, the conductive layer 1023 is formed on the other surface of the upper substrate 1011. In this case, the conductive layer 1023 is beneficially transparent, since the light polarized in the liquid crystal layer 1032 passes through the conductive layer 1023 before being emitted from the display panel 1000.

Therefore, it is desired to make the conductive layer 1023 with a transparent and conductive material. For example, the conductive layer 1023 may be made of a material selected from a group including indium oxide, tin oxide, zinc oxide, indium-tin oxide, indium-zinc oxide, tin-antinomy oxide, graphene, carbon nano tube, silver nano particle, silver nano wire, and thin metal mesh. The conductive layer 1023 is beneficially thin enough to transmit light.

When the conductive layer 1023 is employed by the display panel 1000 according to an exemplary embodiment of the present disclosure, the conductive path 1024 may be in direct contact with a surface of the conductive layer 1023. Further, the conductive path 1024 may be disposed along the non-display area I/A defined by the black matrix 1013. As such, the conductive path 1024 may be in direct contact with a surface of the conductive layer 1023 and located in the non-display area I/A, so that it may have a ring shape to surround the display area A/A.

Static electricity induced by parasitic capacitance on the rear surface of the substrate 1011 or the rear surface of the lower substrate 1032 may interfere with a touch signal. Such static electricity can be reduced or eliminated as the conductive layer 1023 is placed in direct contact with the rear surface of the upper substrate 1011 or the rear surface of the lower substrate 1021, and is referenced to ground potential.

The conductive layer 1023 works as an electric shield of the entire surfaces of the upper substrate 1011 and the lower substrate 1021. Thus, the conductive layer 1023 is also beneficially transparent and has good conductivity. For this reason, to eliminate touch noise more effectively, the conductive path 1024 is formed in direct contact with a surface of the conductive layer 1023 and has less sheet resistance and better conductivity than the conductive layer 1023. Further, the conductive path 1024 is referenced to ground potential via at least one projecting connector portion disposed on one side of the conductive path 1024. By employing the mechanism by which the static electricity induced on the rear surface of the upper substrate 1011 or the rear surface of the lower substrate 1021 is discharged via the conductive layer 1023 and the conductive path 1024, touch signal interference and erroneous touch operation can be reduced.

<Method of Manufacturing Display Device Using the Mask>

A method of manufacturing a display panel according to an exemplary embodiment of the present disclosure includes: moving the mask according to any one of the above-described embodiments or a substrate such that the mask is spaced apart from the substrate, the substrate having a display area and a non-display area around the display area defined thereon; and forming a loop-shaped conductive path on the substrate by performing sputtering on a target made of a conductive material, the conductive path being configured as a single piece.

In the method of manufacturing the display panel using the mask according to any one of the above-described embodiments, the moving the mask or the substrate further includes aligning the central shield portion with the display area while aligning the opening and the peripheral shield portion with the non-display area. In addition, the forming the conductive path on the substrate includes: forming the first portion and the second portion simultaneously. The second portion is formed at an area of the substrate corresponding to the diffusion area.

The method further includes: forming a conductive layer on the substrate. The conductive may be formed prior to the conductive path or vice versa. A surface of the conductive layer is in direct contact with a surface of the conductive path. The conductive layer is transparent and may be made of a material selected from a group including indium oxide, tin oxide, zinc oxide, indium-tin oxide, indium-zinc oxide, tin-antinomy oxide, graphene, carbon nano tube, silver nano particle, silver nano wire, and thin metal mesh. Sputtering may be performed using such materials as a target, to form the conductive layer. The conductive path can be formed of various other metals so long as the metal can be deposited on a targeted surface using the sputtering process.

According to an aspect of the present disclosure, there is provided a display panel. The display panel includes: a display area; a non-display area around the display area; and a loop-shaped conductive path disposed in the non-display area as a single piece. The conductive path includes a first portion and a second portion that have different surface properties and is made of the same conductive material. The loop-shaped conductive path in the second portion has a plurality of depressions of the conductive material in a thickness direction. A thickness of the conductive material between the plurality of depressions is less than a thickness of the first portion. A maximum thickness of the second portion is smaller than a minimum thickness of the first portion. The conductive material is made by a sputtering process.

The sheet resistance of the second portion may be greater than the sheet resistance of the first portion.

The first portion may occupy more area than the second portion does in the conductive path.

The first portion and the second portion may be made of the same material.

The surface roughness of the second portion may be greater than the surface roughness of the first portion.

The maximum width of a cross-section of the second portion cut perpendicular to a direction in which the conductive path is extended may be equal to or less than a maximum width of a cross-section of the first portion cut perpendicular to the direction in which the conductive path is extended.

The conductive path may surround the display area.

The conductive path may have at least one projecting connector portion on a side face thereof.

The display panel may further include: a conductive layer disposed on the display area and the non-display area, wherein the conductive path is in contact with a surface of the conductive layer.

The conductive layer may be transparent and may be made of a material selected from a group including indium oxide, tin oxide, zinc oxide, indium-tin oxide, indium-zinc oxide, tin-antinomy oxide, graphene, carbon nano tube, silver nano particle, silver nano wire, and thin metal mesh.

The conductive layer may be a signal interference shield layer, and the conductive layer and the conductive path may be referenced to ground potential.

The conductive path may be made of a metal or an alloy.

According to another aspect of the present disclosure, there is provided a mask. The mask includes: a central shield portion; a peripheral shield portion; a holding portion connecting the central shield portion with the peripheral shield portion, the holding portion having a surface located in a different plane from where a surface of the central shield portion and a surface of the peripheral shield portion are located; and an opening that is a space by which the central shield portion is spaced apart from the peripheral shield portion. The opening is a single, continuous space and comprises a diffusion area formed along with the holding portion.

The central shield portion may have an isolated, island shape when viewed from a top of the mask.

The central shield portion may be surrounded by the opening, and the peripheral shield portion may surround the opening.

The central shield portion may be partitioned off by the opening as a closed area.

The holding portion may have a level difference with the surface of the central shield portion and the surface of the peripheral shield portion.

The thickness of the central shield portion and thickness of the peripheral shield portion may not be even across the entire areas.

The holding portion may be connected to a side face of the central shield portion and to an opposing side face of the peripheral shield portion.

The sum of a thickness of the holding portion and a thickness of the diffusion area may be equal to or less than a thickness at the side face of the central shield portion and a thickness at the side face of the peripheral shield portion.

The thickness of the holding portion may be smaller than the thickness of the diffusion area.

The holding portion may have a surface located in a different plane from where the surface of the central shield portion and the surface of the peripheral shield portion are located. The holding portion also has the other surface located in the same plane as a plane where the other surface of the central shield portion and the other surface of the peripheral shield portion are located.

The sum of a thickness of the holding portion and a thickness of the diffusion area may be larger than a thickness at the side face of the central shield portion and a thickness at the side face of the peripheral shield portion.

The thickness of the holding portion may be larger than the thickness of the diffusion area.

The at least one holding portion may include two or more holding portions.

According to an aspect of the present disclosure, there is provided a method of manufacturing a display panel. The method of manufacturing a display panel includes: moving the mask according to any one of the above-described embodiments or a substrate such that the mask is spaced apart from the substrate, the substrate having a display area and a non-display area around the display area defined thereon; and forming a loop-shaped conductive path on the substrate by performing sputtering on a target made of a conductive material. The conductive path is configured as a single piece.

The moving the mask or the substrate may further include: aligning the central shield portion with the display area while aligning the opening and the peripheral shield portion with the non-display area.

The forming the conductive path on the substrate may include:

forming the first portion and the second portion simultaneously, wherein the second portion is formed at an area of the substrate corresponding to the diffusion area.

The method may further include: forming a conductive layer on the substrate, wherein a surface of the conductive layer is in direct contact with a surface of the conductive path.

The conductive layer may be transparent and may be made of a material selected from a group consisting of indium oxide, tin oxide, zinc oxide, indium-tin oxide, indium-zinc oxide, tin-antinomy oxide, graphene, carbon nano tube, silver nano particle, silver nano wire, and thin metal mesh.

The forming the conductive path on the substrate may include performing sputtering using a metal or an alloy target.

Thus far, exemplary embodiments of the present disclosure have been described in detail with reference to the accompanying drawings. However, the present disclosure is not limited to the exemplary embodiments, and modifications and variations can be made thereto without departing from the technical idea of the present disclosure.

Accordingly, the exemplary embodiments described herein are merely illustrative and are not intended to limit the scope of the present disclosure. The technical idea of the present disclosure is not limited by the exemplary embodiments. Therefore, it should be understood that the above-described embodiments are not limiting but illustrative in all aspects.

The scope of protection sought by the present disclosure is defined by the appended claims and all equivalents thereof are construed to be within the true scope of the present disclosure.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A display device comprising:
   a substrate having a display area and a non-display area outside the display area;
   a single-pieced, loop-shaped conductive path surrounding the display area in the non-display area on the substrate; and
   a transparent conductive layer continuously disposed in the display and non-display areas and being in direct contact with the single-pieced, loop-shaped conductive path,
   wherein the single-pieced, loop-shaped conductive path includes a first portion and a second portion that are made of a same conductive material,
   wherein the single-pieced, loop-shaped conductive path in the second portion has a plurality of depressions of the conductive material in a thickness direction,
   wherein the transparent conductive layer has a lower electrical conductivity than the single-pieced, loop-shaped conductive path, and
   wherein a sheet resistance of the second portion is greater than a sheet resistance of the first portion.

2. The display device of claim 1, wherein the first portion occupies more area than the second portion does in the single-pieced, loop-shaped conductive path.

3. The display device of claim 1, wherein the second portion has a wavy surface with a plurality of bulges.

4. The display device of claim 1, wherein a width of the loop-shaped conductive path in a transverse direction to a direction in which the single-pieced, loop-shaped conductive path extends is equal to or less than a width of the first portion in the transverse direction.

5. The display device of claim 1, wherein the single-pieced, loop-shaped conductive path has at least one connector portion protruding from a loop of the single-pieced, loop-shaped conductive path.

6. The display device of claim 1, wherein the single-pieced, loop-shaped conductive path is connected to a ground member to discharge an electrostatic charge.

7. The display device of claim 1, wherein a thickness of the conductive material between the plurality of depressions is less than a thickness of the first portion.

8. The display device of claim 7, wherein the conductive material is made by a sputtering process.

9. A display device comprising:
   a substrate having a display area and a non-display area;
   a black layer surrounding the display area in the non-display area on the substrate;
   a loop-shaped conductive path in an area overlapping with the black layer; and
   a conductive layer disposed in the display area and at least a part of the non-display areas on the substrate,
   wherein the loop-shaped conductive path is electrically conductive with the conductive layer and includes a first portion and a second portion, and wherein a thickness of the second portion is smaller than a thickness of the first portion,
   wherein the conductive layer has a lower electrical conductivity than the loop-shaped conductive path, and
   wherein a sheet resistance of the second portion is greater than a sheet resistance of the first portion.

10. The display device of claim 9, wherein a surface roughness of the second portion is greater than a surface roughness of the first portion.

11. The display device of claim 9, wherein the second portion has a surface in a wave-like shape.

12. The display device of claim 11, wherein a maximum thickness of the second portion is smaller than a minimum thickness of the first portion.

13. The display device of claim 9, wherein the second portion has an edge in a wave-like shape.

14. The display device of claim 13, wherein a maximum width of the second portion, in a transverse direction with respect to a direction in which the loop-shaped conductive path extends, is equal to or less than a maximum width of the first portion in the transverse direction.

15. The display device of claim 9, wherein the loop-shaped conductive path includes a conductive material, the conductive material is non-transparent and has a resistance smaller than a resistance of the conductive layer.

* * * * *